(12) United States Patent
Forrester (10) Patent No.: US 6,710,651 B2
(45) Date of Patent: Mar. 23, 2004

(54) SYSTEMS AND METHODS FOR CONTROLLING OUTPUT POWER IN A COMMUNICATION DEVICE

(75) Inventor: Tim Forrester, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 10/035,596

(22) Filed: Oct. 22, 2001

(65) Prior Publication Data

US 2003/0076168 A1 Apr. 24, 2003

(51) Int. Cl.[7] ................................................. H03G 3/20
(52) U.S. Cl. ..................... 330/129; 330/207 P; 455/69; 455/70; 455/522
(58) Field of Search ..................... 330/129, 207 P; 455/115, 117, 126, 69, 70, 522

(56) References Cited

U.S. PATENT DOCUMENTS

| | | | | |
|---|---|---|---|---|
| 4,353,037 A | * | 10/1982 | Miller | 330/298 |
| 5,150,075 A | * | 9/1992 | Hietala et al. | 330/279 |
| 5,212,815 A | * | 5/1993 | Schumacher | 455/126 |
| 5,337,006 A | * | 8/1994 | Miyazaki | 330/130 |
| 5,371,473 A | * | 12/1994 | Trinh et al. | 330/129 |
| 5,564,086 A | * | 10/1996 | Cygan et al. | 455/126 |
| 5,778,308 A | * | 7/1998 | Sroka et al. | 455/115 |
| 5,832,373 A | * | 11/1998 | Nakanishi et al. | 455/126 |
| 5,913,154 A | * | 6/1999 | Wynn | 455/127 |
| 5,956,626 A | * | 9/1999 | Kaschke et al. | 455/115 |
| 6,020,787 A | * | 2/2000 | Kim et al. | 330/279 |
| 6,166,598 A | * | 12/2000 | Schlueter | 330/127 |
| 6,252,455 B1 | * | 6/2001 | Kurby et al. | 330/136 |
| 6,297,696 B1 | * | 10/2001 | Abdollahian et al. | 330/124 R |
| 6,362,690 B1 | * | 3/2002 | Tichauer | 330/298 |
| 2002/0025789 A1 | * | 2/2002 | Hayashihara | 455/115 |
| 2003/0045250 A1 | * | 3/2003 | Haapoja | 455/126 |

* cited by examiner

Primary Examiner—Michael Tokar
Assistant Examiner—Khai Nguyen (57) ABSTRACT

A wireless communication device comprises a power amplifier configured to amplify a power level of a transmit signal to a required transmit power level and a transmission line coupled with the power amplifier. The transmission line is configured to convey the amplified transmit signal. The wireless communication device also comprises a power control circuit that includes a bi-directional coupler detector coupled with the transmission line. The bi-directional coupler detector is configured to sense a forward power level and a reflected power level in the transmission line. The power control circuit may be configured to adjust the required transmit power level based at least in part on the forward and reflected power levels sensed by the bi-directional coupler detector. The power control circuit may also adjust an impedance of an impedance matching circuit based at least in part on the reflected power level sensed by the bi-directional coupler detector.

47 Claims, 5 Drawing Sheets

SYSTEMS AND METHODS FOR CONTROLLING OUTPUT POWER IN A COMMUNICATION DEVICE

BACKGROUND OF THE INVENTION

1. Field of the Invention

The invention relates generally to wireless communication and more particularly to systems and methods for controlling the output power in a wireless communication device.

2. Background

There are several factors that impact the transmit power level in the transmitter of a wireless communication device. Two factors that limit the transmit power level, for example, are: 1) Specific Absorption Rate (SAR) requirements; and 2) Adjacent Channel Power Ratio (ACPR) requirements. SAR is a metric used to evaluate compliance of portable devices with the maximum permissible exposure limits as defined in the FCC guidelines on human exposure to Radio Frequency (RF) emissions. Effectively, the FCC guidelines place a limit on the maximum transmit power of a communication device in order to prevent exposure by users of such devices to excessive levels of RF energy.

ACPR is generally defined as the ratio of the average power in the adjacent frequency channel to the average power in the transmitted frequency channel. In other words, a wireless communication device is configured to transmit over a specific frequency channel at any given time. But due to inherent linearity and other limitations of the components that comprise a communication device transmitter, it is very difficult to prevent the energy transmitted by the device from spreading over into adjacent channels. If too much energy resides in the adjacent channels, then it can interfere with devices operating on those channels. Therefore, many wireless communication standards define limits for ACPR, and even when the applicable standard does not define a limit, ACPR is still a practical limitation.

In order to maintain acceptable SAR and ACPR limits, conventional communication device transmitters typically comprise a power detector, to detect the transmit power level, and an isolator to isolate the transmitter from reflected energy generated at the interface between the transmitter and the device's antenna. For example, in a Frequency Modulation (FM) transmitter, SAR is the limiting issue. Therefore, a power detector can be used to ensure that the output power of the transmitter does not exceed the FCC specified limits. In a transmitter that is implementing a complex modulation scheme, such as Code Division Multiple Access (CDMA) or Time Division Multiple Access (TDMA), on the other hand, there are much more stringent linearity requirements. Thus, ACPR is the limiting issue, although SAR still applies. If the transmitter attempts to produce too much or excessive power is reflected back from the antenna into the transmitter, the linearity and, therefore, the ACPR can be substantially degraded. Accordingly, conventional devices often insert an isolator to block the reflected power and have some means to limit the maximum RF output power if there is a danger of exceeding the transmitter rating before reaching the SAR threshold While the conventional detector/isolator approach has certain advantages, it also has certain limitations that can substantially impact the performance of a wireless communication device. For example, the impedance of the transmission line that conveys the transmitted power to the antenna is designed to match the impedance of the antenna in order to reduce the amount of reflected energy and increase transmission efficiency. But when the communication device is placed next to the human head, for example, the impedance of the antenna changes due to the proximity with the head. As a result, more power is reflected back toward the transmitter. When this reflected energy reaches the isolator it is dissipated as heat. Therefore, the resulting radiated transmit power is much lower than it otherwise could be, even taking into account the SAR limitation.

Additionally, the isolator introduces extra loss into the transmission path that is typically on the order of 0.5 dB. Therefore, the transmitter must supply an extra 0.5 dB of power in order to compensate for the extra loss. Increasing the power, however, also increases the ACPR, i.e., increases the amount of energy in the adjacent channels. Because ACPR is predominantly a 3rd order product, the resulting increase in ACPR is approximately 3 times the increase in transmit power, or 1.5 dB, which can lead to noncompliance with the ACPR requirements. Thus, as can be seen, the conventional detector/isolator approach can have a substantial negative impact on the performance of a wireless communication device.

Figure 1:
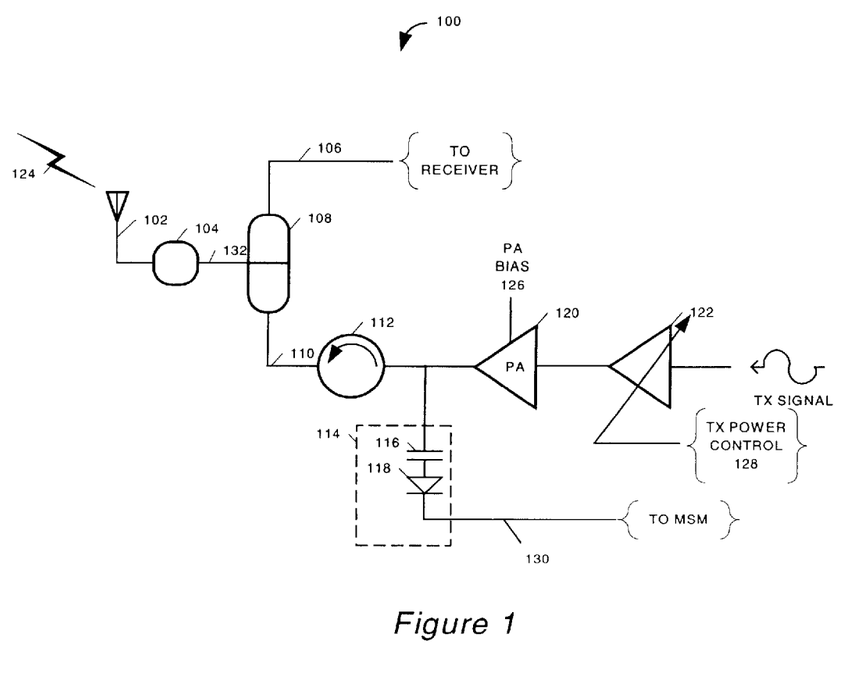
FIG. 1 is a logical block diagram illustrating an exemplary wireless communication transceiver.

FIG. 1 illustrates an exemplary wireless communication transceiver 100. Such a transceiver can be included in a wireless communication device, thus enabling the device to communicate over a wireless communication channel 124 in a wireless communication system. Transceiver 100 actually comprises a receive path 106 and a transmit path 110. Preferably, both paths are interfaced with antenna 102 via a duplexer 108. Duplexer 108 essentially acts as a filter that is configured to shunt incoming RF signals received by antenna 102 to receive path 106. Duplexer 108 is further configured to send outgoing RF signals from transmit path 110 to antenna 102, while providing isolation between paths 106 and 110 so that the incoming and outgoing signals do not interfere with each other.

The received RF signals are then demodulated and processed so as to extract a baseband information signal in the receive portion of transceiver 100 (not shown). Preferably, the baseband information signal is then decoded and processed in a baseband processor (not shown), such as a Mobile Station Modem (MSM). The MSM, or equivalent, is also preferably responsible for generating and encoding baseband information signals that are to be transmitted over communication channel 124. The baseband information signals generated by the MSM (not shown) are then modulated with a RF carrier in the transmit portion of transceiver 100, which generates a RF transmit signal to be transmitted via antenna 102.

The transmit portion of transceiver 100 is also preferably configured to set the power level of the RF transmit signal. In general, Power Amplifier (PA) 120 in conjunction with Variable Gain Amplifier (VGA) 122 generate the required power level as demanded by the MSM. PAs are typically key components in any high frequency RF transmitter design. This is because RF transmitters typically require high output power to compensate for path losses in communication channel 124 and to ensure an adequate signal strength at the base station associated with channel 124. Since the base station can be miles away, it can be difficult to achieve adequate receive power at the base station. At the same time, if the signal power at the base station is too high, then it may interfere with reception by the base station of transmit signals from other devices within the communication system. Transmitting at higher power levels also reduces battery operating time. Therefore, while it is important to ensure an adequate transmit power level, it is also important to ensure that the transmit power level is not too high. Thus, power control in a wireless communication device is an important aspect of wireless communication.

In conventional wireless communication systems, power control is often performed in the wireless communication device. For example, the base station can be configured to measure the power level of a received transmit signal and determine if it is too high or too low. The base station can then be configured to transmit commands to the wireless communication device instructing the device to turn its power up or down. CDMA communication systems, for example, use such a power control loop. In a CDMA system, the goal of the base stations is to receive signals from each of the devices with which it is communicating at the same receive power level. In fact, such power equalization at the base station for each of the devices in communication with the base station is a critical aspect of CDMA operation. Thus, power control is a critical component of device operation in a CDMA system, although it is similarly important in many types of wireless communication systems.

Figure 2:
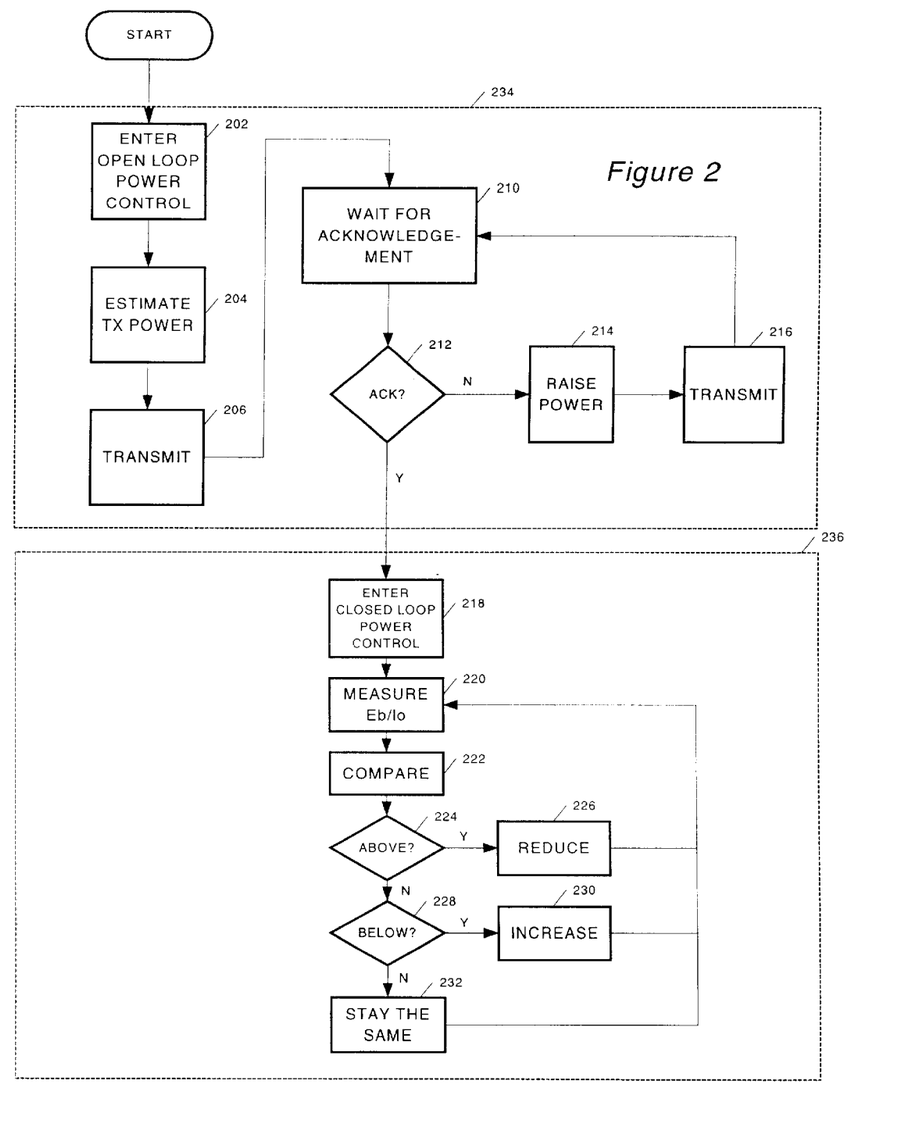
FIG. 2 is a flow chart illustrating an exemplary power control loop process for controlling the transmit power level in the wireless transceiver of FIG. 1.

For illustrative purposes, a simplified power control loop operation for a CDMA system is described in the following paragraphs in conjunction with the flow chart of FIG. 2. The process of FIG. 2 is intended to illustrate the need for power control and the role it plays in wireless communication. It should not, however, be seen as limiting the systems and methods described herein to any particular type of power control, or any particular power control approach. Nor should it be seen as limiting the systems and methods described herein to any particular type of wireless communication system.

Again, in a CDMA system, such as an IS-95 compliant system, the transmit power is controlled in the communication device so that devices communicating with the same base station appear to have the same signal strength at the base station. In each device, the transmit power is variable to compensate for changes in the signal strength as received by the base station. The signal strength at the base station can vary due to changing distances between a communication device and the base station and such factors effecting communication channel 124 as multipath fading, varying terrain topology, and varying environmental conditions.

Referring to FIG. 2, the power control loop in a CDMA system, begins by entering an open loop power control sequence 234 in step 202. Once in open loop sequence 234, the device will estimate an initial transmit power in step 204. For example, the initial estimate can be made using a predetermined loop power equation such as the following equation:

$$Rx \text{ power} + Tx \text{ power} = -73 \, dBm \quad (1)$$

In equation (1), Rx power is the signal strength of a RF signal received from the bases station over communication channel 124 by antenna 102. Once this received power level is determined, e.g., via a Received Signal Strength Indication (RSSI) measurement, then it can be used by loop equation (1) to determine the initial transmit power, or Tx power, in step 204. The device will then transmit a signal at this initial power level to the base station in step 206 and wait for an acknowledgement from the base station in step 210. If the device does not receive an acknowledgement in step 212, then it will increase the transmit power in step 214, transmit again in step 216, and again wait for acknowledgement (step 210). Typically, a device may need to increase its power 1 or 2 times before receiving the acknowledgement.

The open loop process is a coarse estimate of the required transmit power. Thus a tolerance of +/−9 db is, for example, allowed on the open loop estimate of the required power. Once the device receives an acknowledgement (step 212), however, it enters, in step 218, a closed loop power sequence 236 in which the transmit power level estimate is refined. The goal of closed loop power control sequence 236 is to ensure that the power received at the base station is the minimum level of power required for each device with which the base station is communicating.

Once in closed loop sequence 236, the base station measures the received power-to-interference-ratio (Eb/Io) and compares the measured value to a minimum and a maximum threshold in step 222. If the base station determines that the measured Eb/Io is above the maximum threshold in step 224, then, in step 226, it sends a command to the device to reduce its power. If, on the other hand, the base station determines in step 228 that the Eb/Io is below the minimum threshold, then it sends a command to the device to raise its transmit power level in step 230. Of course, the measured Eb/Io may be between the minimum and maximum thresholds in which case there would be no need for the device to modify its power. In such a situation, the device can be instructed to maintain the same transmit power level in step 232. The measurement (step 220) and comparison (222) is preferably repeated periodically, e.g., every 1.25 ms, or 800 times per second. Thus, it can be seen that power control plays an important role in proper operation of a communication device within a wireless communication system.

Referring again to FIG. 1, there are several ways that a device can control the output power in transceiver 100. Because the transmit power may have to be varied over a large range typically in excess of 70 dB, one way to control the output power is by varying the gain of VGA 122. Further to ensure improved transmitter efficiency at lower power levels, PA bias 126 may also be adjusted as required. VGA 122 can be configured to amplify the transmit signal before it is sent to PA 120. How much VGA 122 amplifies the transmit signal can be controlled via a TX POWER CONTROL signal 128, which can be generated by an MSM (not shown) or some other baseband control circuit (not shown).

Proper control of the transmit power level, as explained above, can be critical for efficient operation of a wireless communication device in a wireless communication system. There are other limits, however, on the transmit power level in transceiver 100. For example, as explained above, SAR limitations may restrict the transmit power level regardless of what the power control loop operation may dictate. To ensure that the SAR limitations are not exceeded, conventional wireless communication devices typically employ some sort of power detector 114. In transceiver 100, power detector 114 comprises a diode 118. The output 130 of detector 114 is then sent to a MSM (not shown) or some other baseband control circuit (not shown).

The analog voltage generated by the detector 114 represents the generated transmit power level and can be converted to a digital number, by means of an analog-to-digital converter for example, such that the MSM (not shown) can adjust the gain of VGA 122 accordingly to meet the desired transmit power level. Notably, however, such a power detection scheme does not take into account reflected power that is dissipated in isolator 112. Isolator 112 is included because the reflected power can have an adverse effect, e.g., increased ACPR especially at high transmit power levels, if it is allowed to interact with the transmit signal being generated by PA 120.

Reflected power occurs because of mismatches in the impedance between the transmission line 132 conveying the transmit signal and antenna 102. The amount of reflected power is determined by the reflection coefficient, which is a measure of the mismatch in impedance between antenna 102 and transmission line 132. To lower the reflection coefficient, and thereby reduce the amount of reflected power, conventional devices typically include matching circuit 104. The purpose of matching circuit 104 is to match the impedance of transmission line 132 with that of antenna 102. In practice, however, it is very difficult to achieve a perfect match. Therefore, some of the transmit power is reflected back toward PA 120. The reflected power generates a standing wave on transmission line 132 from the interaction between the forward and reflected signals. Voltage Standing Wave Ratio (VSWR) is a metric used to determine how much of the transmitted power is making it out at antenna 102. VSWR can be defined by the following equation:

$$VSWR = (Vfwd + Vref)/(Vfwd - Vref) \quad (2)$$

In equation (2), Vfwd is a measure of the voltage level of the transmit signal on transmission line 132 and Vref is a measure of the voltage level of the reflected signal. If impedance matching circuit 104 provides a perfect match, then the ratio is 1:1 and maximum power will be delivered to antenna 102. Any deviation from this condition, i.e., a VSWR greater than 1:1, and less than maximum power is delivered to antenna 102.

If it were not for isolator 112, the reflected power would travel back toward PA 120, reflect again, and travel back toward antenna 102. Therefore, at least some portion of the reflected power would eventually get out at antenna 102. Thus, a transceiver can be designed for a VSWR of approximately 2:1 and still have sufficient performance. But in transceiver 102, the reflected power is actually dissipated in isolator 112 as heat. Thus, any deviation from a VSWR of 1:1 results in wasted transmit power and reduced talk time. But detector 114 does not take into account the effect of isolator 112 and, as a result, transceiver 100 can actually be operating well below SAR limits when the device is limiting the PA output due to the measurements from detector 114.

For example, it is not uncommon for the VSWR to degrade from 2:1 to approximately 3:1 when a wireless communication device is placed next to a human head during operation. A VSWR of 3:1, however, means that 25% of the transmit power is reflected back into the device, where it is dissipated as heat in isolator 112. Because this power is wasted, the power level is much lower than expected. This not only results in inefficient operation of transceiver 100, but can actually cause the device to lose its connection with the base station. Even if detector 114 is not causing the transmit power level to be limited, PA 120 must operate at excessive power levels in order to compensate for the transmit power wasted in isolator 112, which not only reduces battery capacity but can also raise ACPR.

As mentioned above, isolator 112 also typically adds approximately 0.5 dB of loss to the transmission path, which requires PA 120 to increase the transmit power level to compensate. Not only does this result in inefficient operation of PA 120 and reduces battery life among other things, but it also causes the ACPR to increase. Because ACPR is a 3rd order product, a 0.5 dB increase in transmit power will result in approximately a 1.5 dB increase in ACPR, which may cause excessive interference in the adjacent channel.

In view of the above discussion, it can be seen that the use of detector 114 and isolator 112 can have a substantial negative impact on the performance of transceiver 100.

SUMMARY OF THE INVENTION

Thus, it is an objective of the invention to eliminate the need for an isolator in the transmitter of a wireless communication device. It is a further objective to provide dynamic control of the transmit power level in the transmitter in order to maintain maximum output power, while still meeting such limitations as SAR and ACPR. In one aspect of the invention, the systems and methods for controlling output power in a communication device use a power control circuit to sense both the forward and reflected power levels in the transmission path between the transmitter and the antenna. The power control circuit is then configured to control the transmit power level of the transmitter based on the power levels that it senses.

For example, in one particular implementation the transmitter power level can be optimally controlled by adjusting a Power Amplifier (PA) drive signal in accordance with inputs from a MSM, such as a demanded transmit power input, and by forward/reverse powers detected by the power control circuit. For example in an extreme case where forward and reflected powers are identical (100% power reflection), this invention would reduce drive power to the PA to a very low level and avoid the condition of dissipating excess power as heat. Further the power control system would adjust the PA bias to the most appropriate point for a given output level. For higher power levels where high linearity is required the bias would be increased. For lower power levels the bias point would be decreased, but not to a point where ACPR is impacted.

In another aspect of the invention, the power control circuit may also adjust an impedance of an impedance matching circuit based at least in part on the reflected power level sensed by the bi-directional coupler detector.

These embodiments as well as other features, advantages, and embodiments are described below in conjunction with the following drawings.

BRIEF DESCRIPTION OF THE DRAWINGS

Preferred embodiments of the present inventions taught herein are illustrated by way of example, and not by way of limitation, in the figures of the accompanying drawings, in which.

DETAILED DESCRIPTION OF THE PREFERRED EMBODIMENTS

Figure 3:
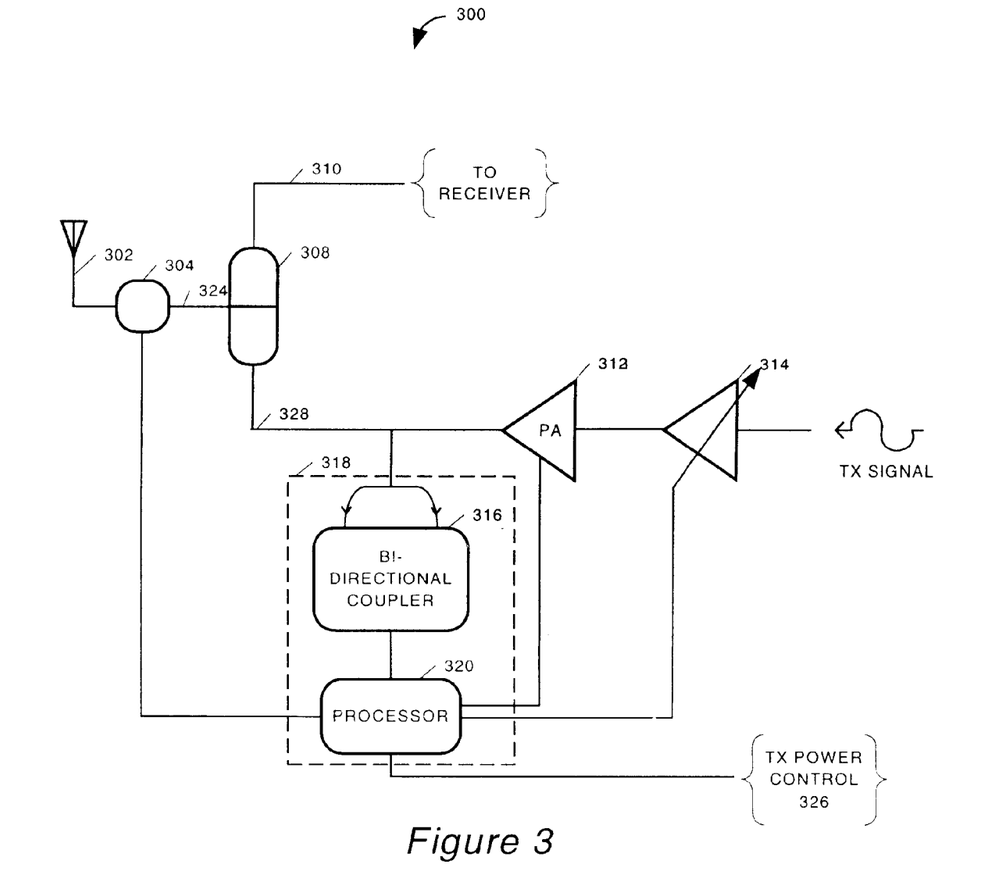
FIG. 3 is a logical block diagram illustrating an example embodiment of a wireless communication transceiver in accordance with the invention.

FIG. 3 illustrates an example embodiment of a transceiver 300 designed in accordance with the systems and methods described herein. As can be seen, transceiver 300 can comprise an antenna 302, matching circuit 304, duplexer 308, receive path 310, transmit path 328, PA 312, and VGA 314, which operate in substantially the same manner as described in relation to the similar components of transceiver 100. Instead of isolator 112, however, transceiver 300 includes power control circuit 318, which preferably comprises bi-directional coupler detector 316 and a processor 320. Processor 320 can be a DSP, microcontroller, microprocessor, or any other type of controller capable of implementing the systems and methods as described herein. Further Processor 320 can be integrated within the MSM.

Bi-directional coupler detector 316 is configured to sense both the forward and reflected power levels on transmission line 328. By comparing these two power levels, power control circuit 318 can accurately determine the actual amount of transmit power reaching antenna 302 and sent over communication channel 124. Thus, the transmit power level can be more accurately controlled in order to meet a variety of limitations and/or design criteria, such as SAR, power consumption (battery life), and base station receive power level requirements. Moreover, the reflected power can be monitored to ensure that it remains below an absolute predetermined level in order to avoid excessive ACPR. If the reflected power exceeds the absolute predetermined level, power control circuit 318 can be configured to cause the transmit power level to be reduced in order to bring the reflected power level and, therefore, the ACPR level down to an acceptable level.

Preferably, processor 320 is configured to control the transmit power level in the same ways described above. Thus, processor 320 is preferably interfaced with VGA 314 in such a manner as to be able to modify the gain of the VGA 314, which is preferably initially set in accordance with instruction from the MSM (not shown). It will be appreciated that power control circuit 318 may not include a processor 320. In that case, power control circuit 318 would be coupled to some other suitable controller for performing the functions described herein with reference to processor 320. A MSM (not shown), for example, could be configured to perform these functions.

By eliminating isolator 112, significant savings can be recognized in the construction of transceiver 300 including savings in cost, component count, and board area. Moreover, power control circuit 318 helps to provide greater control over the transmit power level, which results in better performance, reduced power consumption, and increased battery life.

Figure 4:
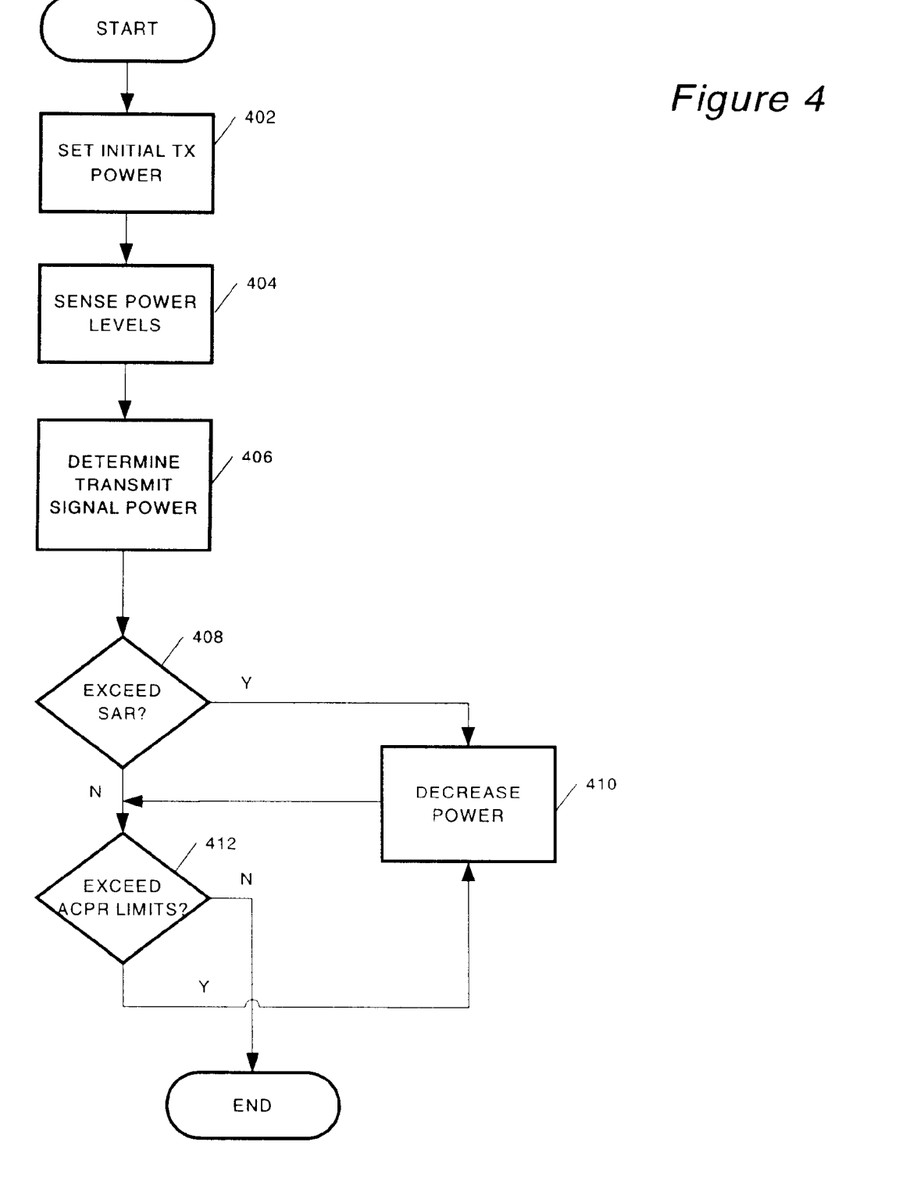
FIG. 4 is flow chart illustrating an example embodiment of a process for controlling the transmit power level in the wireless transceiver of FIG. 3 in accordance with the invention.

FIG. 4 is a flow chart illustrating an example method whereby power control circuit 318 can control VGA 314 and PA 312 in order to control the transmit power level in a transceiver such as transceiver 300. First, in step 402, the power control circuit 318 can receive a control signal instructing that the gain of VGA 314 be set to a predetermined level. For example, power control circuit 318 can be instructed to set the gain such that the transmit power level is equal to an initial power level as determined using equation (1) or an equivalent equation. Alternatively, the initial gain can be set by the MSM (not shown) or other baseband control circuit (not shown).

Next, in step 404, bi-directional coupler detector 316 senses the forward and reverse power levels on transmission line 324. Then in step 406, power control circuit 318 accurately determines the amount of transmit signal power reaching antenna 302 and actually being radiated by comparing the forward and reverse power levels. If the power level reaching antenna 302 and being radiated exceeds the SAR limitations as determined in step 408, then in step 410 the power control circuit 318 can decrease the transmit power level by varying the gain of VGA 314, for example. Alternatively, power control circuit 318 can be interfaced with the MSM (not shown), or other baseband control circuit (not shown), configured to control the gain. Thus, after making the determination in step 408, power control circuit 318 can cause the MSM (not shown) or baseband control circuit (not shown) to reduce the transmit power level.

In step 408, bi-directional coupler detector 316 determines if the reflected power level is excessive enough to raise the ACPR to an unacceptable level. If it is, then the process again goes to step 410 and the transmit power level is reduced.

Power control circuit 318 can be implemented in hardware or software. Preferably, however, the power control circuit 318 comprises a processor, e.g., processor 320, to executing software/firmware instructions in such a manner as to perform the steps described in the above paragraphs. This allows flexibility to reprogram power control circuit 318, which can be useful in the face of varying SAR or ACPR requirements, for example.

Figure 5:
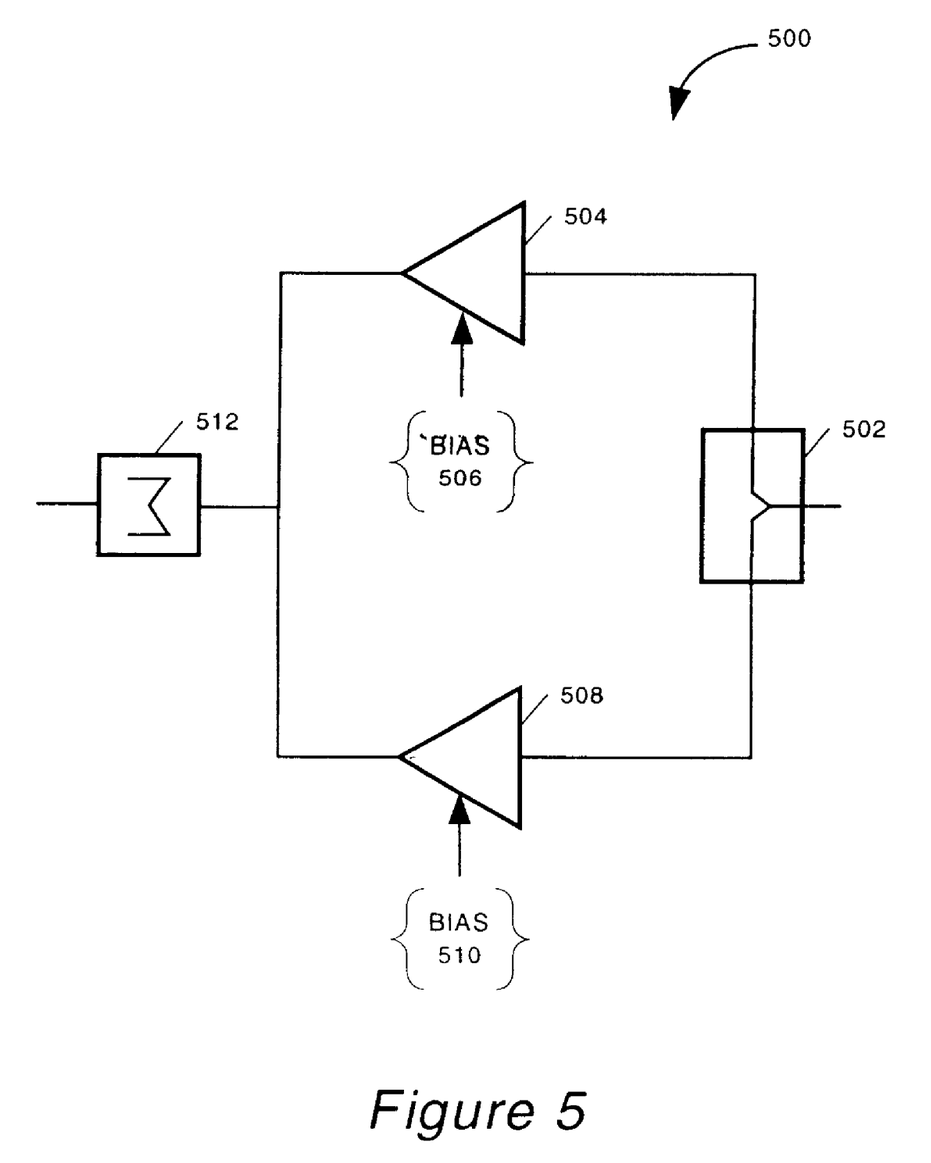
FIG. 5 is a logical block diagram illustrating an exemplary power amplifier for use in the transceiver of FIG. 3.

A push-pull PA design can be used for PA 312 to further reduce ACPR and enhance power conservation within transceiver 300. FIG. 5 illustrates an example push-pull PA 500 that can be used in transceiver 300. PA 500 comprises an in-phase path and an out-of-phase path, which originate at splitter 502. Splitter 502 receives a transmit signal and sends an in-phase signal to amplifier 504, which is supplied by BIAS 506. Splitter 502 also sends an out-of-phase signal to amplifier 508, supplied by BIAS 510. The out-of-phase signal is 180° out of phase with the in-phase signal. After amplification in amplifiers 504 and 508, respectively, the two signals are then balanced and combined in combiner 512.

The transmitter linearity performance can be controlled by varying the amplifier biases BIAS 506 and BIAS 510, respectively. The total transmit power level is the combination of the power levels of the signals in both the in-phase and out-of-phase signal paths. Thus, one advantage of PA 500 is that one or the other of amplifiers 504 and 508 can be completely shut off when the total transmit power requirement is low. This can be accomplished, for example, by simply removing the appropriate bias signal. Thus the overall efficiency at low powers is greatly improved.

In another embodiment, the power control circuit 318 can be configured to control the impedance of matching circuit 304 in order to reduce the amount of reflected power. This capability allows the power control circuit 318 further means of lowering the ACPR and ensuring more efficient operation of transceiver 300. Thus, for example, the actual impedance presented by antenna 302 can change as the communication device is brought near the human head, for example. The change in impedance increases the amount of reflected energy and increases the VSWR. In transceiver 300, the increased amount of reflected power will also increase ACPR, since there is no isolator to prevent the reflected power from mixing with the transmit signal. To prevent this from occurring, power control circuit 318 can be configured to modify the impedance of matching circuit 304 so as to provide a better match and reduce the amount of reflected power.

In one implementation, the power control circuit 318 can be configured to control the impedance of matching circuit 304 by switching in and out more or less impedance. A matching circuit 304 typically comprises various inductive and capacitive components in various configurations. Thus, for example, the power control circuit 318 can be configured to switch in and out inductive and/or capacitive components to alter the impedance of matching circuit 304.

Impedance matching using fixed valued inductive components and capacitors is difficult to achieve and highly application specific. Therefore, only a limited amount of impedance control can practically be achieved in the manner just described. In another implementation, however, matching circuit 304 can comprise a ferro-electric tunable inductive components and capacitors, the impedance of which can be much more easily controlled to provide dynamic impedance matching for transceiver 300. Systems and methods for controlling the impedance of a ferro-electric tunable matching circuit are described more fully in U.S. patent application Ser. No. 09/927,732, entitled "Tunable Matching Circuit," filed Aug. 8, 2001, which is fully incorporated herein by reference. Thus, by using the systems and methods described in U.S. patent application Ser. No. 09/927,732, the advantages of the systems and methods described herein are even further enhanced and extended.

It should be noted that the above examples are provide for illustration only and are not intended to limit the invention to any particular type of transceiver architecture or to any particular type of wireless communication device. Moreover, the systems and methods described herein do not necessarily need to be implemented in a transceiver, they can, for example, be implemented in a device that solely comprise a transmitter incorporating a power control circuit 318. Thus, while embodiments and implementations of the invention have been shown and described, it should be apparent that many more embodiments and implementations are within the scope of the invention. Accordingly, the invention is not to be restricted, except in light of the claims and their equivalents.

What is claimed is:

1. A power control circuit comprising a bi-directional coupler detector configured to couple the power control circuit with a transmission line and to sense a forward power level and a reflected power level in the transmission line, the power control circuit configured to:
   determine the amount of transmit signal power being radiated by an antenna interfaced with the transmission line;
   determine if the radiated signal power exceeds a first threshold;
   if the radiated signal power does exceed the first threshold, then decrease a transmit signal power level;
   determine if the radiated signal power exceeds a second threshold; and
   if the radiated signal power does exceed the second threshold, then decrease the transmit signal power level.

2. The power control circuit of claim 1, configured to decrease the transmit signal power level by controlling the amplification of a power amplifier.

3. The power control circuit of claim 1, configured to decrease the transmit signal power level by controlling the amplification of an in-phase transmission path and an out-of-phase transmission path of a power amplifier.

4. The power control circuit of claim 3, wherein decreasing the transmit signal power level can include turning off one of the in-phase and out-of-phase transmission paths.

5. The power control circuit of claim 1, configured to decrease the transmit signal power level by controlling a variable gain amplifier.

6. The power control circuit of claim 5, wherein controlling the variable gain amplifier comprises varying a gain of the variable gain amplifier.

7. The power control circuit of claim 1, wherein the first threshold is based on SAR requirements.

8. The power control circuit of claim 1, wherein the second threshold is based on ACPR requirements.

9. The power control circuit of claim 1, wherein determining the radiated signal power comprises comparing the sensed forward and reflected 1 power levels.

10. The power control circuit of claim 1, wherein the power control circuit is configured to operate at low transmit signal power levels used in CDMA systems.

11. A wireless communication device, comprising:
   a power amplifier configured to amplify a power level of a transmit signal to a required transmit power level;
   a transmission line coupled with the power amplifier, the transmission line configured to convey the amplified transmit signal; and
   a power control circuit including a bi-directional coupler detector coupled with the transmission line, the bi-directional coupler detector configured to sense a forward power level and a reflected power level in the transmission line, the power control circuit configured to:
      determine the amount of transmit signal power being radiated by an antenna interfaced with the transmission line;
      determine if the radiated signal power exceeds a first threshold;
      if the radiated signal power does exceed the first threshold, then decrease a transmit signal power level;
      determine if the radiated signal power exceeds a second threshold; and
      if the radiated signal power does exceed the second threshold, then decrease the transmit signal power level.

12. The wireless communication device of claim 11, further comprising an antenna coupled with the transmission line, wherein the transmission line is configured to convey the amplified transmit signal from the power amplifier to the antenna, and wherein the antenna is configured to transmit the amplified transmit signal.

13. The wireless communication device of claim 12, further comprising an impedance matching circuit configured to match an impedance of the transmission line to an impedance of the antenna in order to reduce a magnitude of the reflected power level.

14. The wireless communication device of claim 11, wherein the power control circuit is configured to decrease the transmit signal power level by controlling the amplification provided by the power amplifier.

15. The wireless communication device of claim 14, wherein the power amplifier comprises an in-phase transmission path and an-out-of phase transmission path, and wherein the power control circuit is configured to decrease the transmit signal power level by controlling the amplification provided by the in-phase transmission path and the out-of-phase transmission path.

16. The wireless communication device of claim 15, wherein decreasing the transmit signal power level can include turning off one of the in-phase and out-of-phase transmission paths.

17. The wireless communication device of claim 11, further comprising a variable gain amplifier coupled with the power amplifier, the variable gain amplifier configured to generate the transmit signal, wherein the power control circuit is configured to decrease the transmit signal power level by controlling the variable gain amplifier.

18. The wireless communication device of claim 17, wherein controlling the variable gain amplifier comprises varying a gain of the variable gain amplifier.

19. The wireless communication device of claim 11, wherein the first threshold is based on SAR requirements.

20. The wireless communication device of claim 11, wherein the second threshold is based on ACPR requirements.

21. The wireless communication device of claim 11, wherein determining the radiated signal power comprises comparing the sensed forward and reflected 1 power levels.

22. The wireless communication device of claim 11, wherein the power control circuit is configured to operate at low transmit signal power levels used in CDMA systems.

23. A wireless communication device, comprising:
   a transmission line configured to convey a transmit signal;
   an impedance matching circuit coupled with the transmission line, the impedance matching circuit configured to match the impedance of the transmission line with a required output impedance; and
   a power control circuit including a bi-directional coupler detector coupled with the transmission line, the bi-directional coupler detector configured to sense a reflected power level in the transmission line, the power control circuit configured to:
      determine the amount of transmit signal power being radiated by an antenna interfaced with the transmission line;
      determine if the radiated signal power exceeds a first threshold;
      if the radiated signal power does exceed the first threshold, then adjust the impedance of the impedance matching circuit;
      determine if the radiated signal power exceeds a second threshold; and
      if the radiated signal power does exceed the second threshold, then adjust the impedance of the impedance matching circuit.

24. The wireless communication device of claim 23, wherein the impedance matching circuit comprises a ferro-electric tunable matching circuit, and wherein the power control circuit is configured to adjust the impedance of the impedance matching circuit by tuning the ferro-electric tunable matching circuit.

25. The wireless communication device of claim 23, further comprising a power amplifier coupled with the transmission line, the power amplifier configured to amplify a signal power level of the transmit signal to a required transmit signal power level and to drive the amplified transmit signal down the transmission line.

26. The wireless communication device of claim 25, wherein the power control circuit is configured to adjust the required transmit signal power level by controlling the amplification provided by the power amplifier.

27. The wireless communication device of claim 26, wherein the power amplifier comprises an in-phase transmission path and an-out-of phase transmission path, and wherein the power control circuit is configured to adjust the required transmit signal power level by controlling the amplification provided by the in-phase transmission path and the out-of-phase transmission path.

28. The wireless communication device of claim 27, wherein adjusting the required transmit signal power level can include turning off one of the in-phase and out-of-phase transmission paths.

29. The wireless communication device of claim 25, further comprising a variable gain amplifier coupled with the power amplifier, the variable gain amplifier configured to generate the transmit signal, wherein the bi-directional coupler detector is configured to adjust the required transmit signal power level by controlling the variable gain amplifier.

30. The wireless communication device of claim 29, wherein controlling the variable gain amplifier comprises varying a gain of the variable gain amplifier.

31. The wireless communication device of claim 23, wherein the bi-directional coupler detector is further configured to sense a forward power level in the transmission line, and wherein the power control circuit is configured to adjust a transmit power level based at least in part on the forward and reflected power levels sensed by the bi-directional coupler detector.

32. The wireless communication device of claim 23, further comprising an antenna coupled with the transmission line, the antenna configured to transmit the amplified transmit signal, and wherein the matching circuit is configured to match the impedance of the transmission line to the impedance of the antenna.

33. The wireless communication device of claim 23, wherein the first threshold is based on SAR requirements.

34. The wireless communication device of claim 23, wherein the second threshold is based on ACPR requirements.

35. The wireless communication device of claim 23, wherein determining the radiated signal power comprises comparing a sensed forward and reflected power levels.

36. The wireless communication device of claim 23, wherein the power control circuit is configured to operate at low transmit signal power levels used in CDMA systems.

37. A method of controlling output power in a wireless communication device, comprising:
   sensing a forward power level of a transmit signal as the transmit signal travels from a power amplifier to an antenna of the wireless communication device;
   sensing a power level of a portion of the transmit signal that is reflected back toward the power amplifier;
   determine the amount of transmit signal power being radiated by an antenna interfaced with the transmission line;
   determine if the radiated signal power exceeds a first threshold;
   if the radiated signal power does exceed the first threshold, then decrease a transmit signal power level;
   determine if the radiated signal power exceeds a second threshold; and
   if the radiated signal power does exceed the second threshold, then decrease the transmit signal power level.

38. The method of claim 37, further comprising adjusting an impedance of an impedance matching circuit based at least in part on the sensed reflected power level.

39. The method of claim 37, wherein decreasing the transmit signal power level-comprises adjusting a bias voltage of the power amplifier.

40. The method of claim 37, wherein decreasing the transmit signal power level comprises adjusting a gain of a variable gain amplifier.

41. The method of claim 37, wherein the first threshold is based on SAR requirements.

42. The method of claim 37, wherein the second threshold is based on ACPR requirements.

43. The method of claim 37, wherein determining the radiated signal power comprises comparing the sensed forward and reflected power levels.

44. A wireless communication device configured to communicate using low power level CDMA signals, comprising a power control circuit including a bi-directional coupler detector coupled with the transmission line, the bi-directional coupler detector configured to sense a forward power level and a reflected power level in the transmission line, the power control circuit configured to:

determine the amount of transmit signal power being radiated by an antenna interfaced with the transmission line;

determine if the radiated signal power exceeds a first threshold;

if the radiated signal power does exceed the first threshold, then decrease a transmit signal power level;

determine if the radiated signal power exceeds a second threshold; and if the radiated signal power does exceed the second threshold, then decrease the transmit signal power level.

45. The wireless communication device of claim 44, wherein the first threshold is based on SAR requirements.

46. The wireless communication device of claim 44, wherein the second threshold is based on ACPR requirements.

47. The wireless communication device of claim 44, wherein determining the radiated signal power comprises comparing the sensed forward and reflected power levels.

* * * * *